United States Patent [19]

Lagendijk

[11] Patent Number: 5,028,566

[45] Date of Patent: Jul. 2, 1991

[54] METHOD OF FORMING SILICON DIOXIDE GLASS FILMS

[75] Inventor: Andre Lagendijk, Oceanside, Calif.

[73] Assignee: Air Products and Chemicals, Inc., Allentown, Pa.

[21] Appl. No.: 559,009

[22] Filed: Jul. 27, 1990

Related U.S. Application Data

[63] Continuation-in-part of Ser. No. 336,928, Apr. 12, 1989, abandoned, which is a continuation of Ser. No. 36,979, Apr. 10, 1987, abandoned.

[51] Int. Cl.$^5$ ............................. H01L 21/285
[52] U.S. Cl. ..................... 437/238; 437/240; 437/235; 148/DIG. 118; 427/255.3; 427/255.2; 427/255.1; 423/336; 423/337
[58] Field of Search ............... 437/235, 238, 240, 243; 427/255.1, 255.2, 255.3; 423/336, 337; 148/DIG. 118, DIG. 133

[56] References Cited

U.S. PATENT DOCUMENTS

| | | | |
|---|---|---|---|
| 2,399,687 | 5/1946 | McNabb | 423/337 |
| 3,109,747 | 11/1963 | Foote | 423/337 |
| 4,168,330 | 9/1979 | Kaganowicz | 427/39 |
| 4,173,661 | 11/1979 | Bourdon | 427/39 |
| 4,571,366 | 2/1986 | Thomas et al. | 437/164 |
| 4,605,450 | 8/1986 | Thomas et al. | 437/164 |
| 4,619,719 | 10/1986 | Thomas et al. | 437/164 |
| 4,877,651 | 10/1989 | Dory | 437/238 |
| 4,894,352 | 1/1990 | Lane et al. | 437/238 |
| 4,916,091 | 4/1990 | Freeman et al. | 437/238 |

FOREIGN PATENT DOCUMENTS 5142097 10/1974 Japan .................. 423/337
50-16148 6/1975 Japan .
1242474 8/1969 United Kingdom .

OTHER PUBLICATIONS

Kern et al., "Low Pressure Chemical Vapor Deposition for Very Large-Scale Integration Processing—A Review", IEEE Trans. on Electron Devices, vol. ED-26, No. 4, Apr. 1979, pp. 647-657.

Adams, "Dielectric and Polysilicon Film Deposition", in *VLSI Technology*, edited by S. M. Sze, McGraw-Hill, 1983.

Wolf et al., *Silicon Processing for the VLSI Era*, vol. 1-Process Technology, Lattice Press, 1986.

J. C. Schumacher Company, Product Data Sheet No. 6, "Tetraethyl Orthosilicate (TEOS)".

J. C. Schumacher Company, Product Application Note No. 15, "TEOS and Liquid Dopant Sources for CVD SiO$_2$, PSG, BPSG."

J. C. Schumacher Company, Technical Article, "The Deposition of Silicon Dioxide Films at Reduced Pressure".

J. C. Schumacher Company, Product Application Note No. 8, "Tetraethyl Orthosilicate for Semiconductor High Temp. Silicon Dioxide Depositions".

Ghandhi, *VLSI Fabrication Principles*, John Wiley and Sons, 1983.

*Primary Examiner*—Olik Chaudruri
*Assistant Examiner*—M. Wilczewski
*Attorney, Agent, or Firm*—James C. Simmons; William F. Marsh

[57] ABSTRACT

The manufacture of semiconductor devices and, specifically, deposition of SiO$_2$ films on semiconductor devices by oxidative decomposition of oligo siloxanes at low temperature is disclosed.

10 Claims, 4 Drawing Sheets

METHOD OF FORMING SILICON DIOXIDE GLASS FILMS

This application is a continuation-in-part of U.S. patent application Ser. No. 07/336,928 filed Apr. 12, 1989 which is a continuation of U.S. patent application Ser. No. 07/036,979 filed Apr. 10, 1987 both now abandoned.

FIELD OF THE INVENTION

This invention relates to the manufacture of semiconductor devices and, specifically, to the deposition of $SiO_2$ coatings on semiconductor devices.

BACKGROUND OF THE INVENTION

It is common practice in the industry to form silicon dioxide films, either doped or undoped according to the particular application, on or as a layer in semiconductor devices. The literature is replete with discussions of the function of such layers and various methods of forming silicon dioxide layers. See, for example, Thomas, HANDBOOK OF TRANSISTORS, SEMICONDUCTORS, INSTRUMENTS AND MICROELECTRONICS, Prentice Hall, Englewood Cliffs, N.J. 1968 and the extensive publications of the J. C. Schumacher Company, e.g. *Tetraethyl Orthosilicate (TEOS)*, Product Data Sheet No. 6; *Tetraethyl Orthosilicate for Semiconductor High Temperature Silicon Dioxide Depositions*, Product Application Note No. 8; *TEOS and Liquid Dopant Sources for CVD $SiO_2$, PSG, and BPSG*, Product Application Note No. 15; Adams and Capio, *The Deposition of Silicon Dioxide Films at Reduced Pressure*, Technical Article Reprint No. 5.

Thus, the deposition of doped and undoped silicon oxide films is an important process in semiconductor device fabrication. The silicon source usually is a toxic and pyrophoric gas. The use of safer liquid sources is the goal of many investigators. F. S. Becker and D. Pawlik, ECS 85-2 (85)380, ECS 86-8 p148 "A New LPCVD Borophosphosilicate Glass Process Based on the Doped Deposition of TEOS-Oxide". G. Smolinsky and T. P. H. F. Wendling, JECS 132(85)950 "Measurement of the Temperature Dependent stress of Silicon Oxide Films Prepared by a Variety of CVD Methods". G. Smolinsky and R. E. Dean "LPCVD of Silicon Oxide Films in the Temperature Range of 410° to 600° C. from Diacetoxyditertiarybutylsilane". F. S. Becker, D. Pawlik, H. Schaefer, and G. Staudigl, JVST B4(86)232 "Process and Film Characterization of Low Pressure TEOS-Borophosphosilicate Glass". D. S. Williams and E. A. Dein "LPCVD of Borophosphosilicate Glass from Organic Reactants". The thermal decomposition of tetraethoxysilane (TESO) has been used for over twenty years to obtain undoped silicon dioxide films in the temperature range from 600° to 800° C., A. Hochberg and D. O'Meara "LPCVD of Silicon Dioxide Films from Tetraethyoxysilane". An excellent text on the various processes for deposition of thin films is *Thin Film Processes* edited by John L. Vossen and Werner Kern, published by Academic Press Inc., Orlando, Fla. 32887.

The development of a phosphorus doped film, using liquid sources, has been hindered by the lack of a suitable phosphorus source. Trimethylphosphate (TMPO) with TEOS does not provide more than 3 w/o phosphorus, while trimethylphosphite (TMPI) is too reactive above 600° C. TMPO has been used with TEOS at lower temperatures to produce doped films.

A liquid source producing undoped silicon oxide films at temperatures from 500° to 600° C. would allow for controlled incorporation of phosphorus from TMPI as well as boron doping from trimethylborate (TMB).

The chemistry of the siloxanes is well developed, see e.g. article entitled "*Silicones*" in Kirk-Othmer, ENCYCLOPEDIA OF CHEMICAL TECHNOLOGY. While there are some variations in the terminology used to describe the siloxanes, the present description of compounds of the formula $$(H_nR_{2-n}SiO)_m$$

wherein $n=0-2$, and m is 3 or greater, and R is lower 1–8 carbon alkyl, aryl or aralkyl, is consistent with commonly used rules of nomenclature. Siloxanes and polymers thereof, frequently called silicones, have found application in a great variety of industries and for a wide array of purposes in industry, medicine, the arts and in the household.

Siloxanes are used in the semiconductor and electronics industry, principally as silicone potting, shock absorbing, or coating materials, and in masks used in manufacturing of semiconductors. A process for forming a doped oxide film and a composite article by modifying polysiloxane with a dopant, coating the mixture on a substrate and heating coated substrate to diffuse the dopant onto the substrate is described in U.S. Pat. Nos. 4,605,450, 4,571,366 and 4,619,719, wherein a silicon tetra-alkoxide is reacted with a limited amount of water to produce a low molecular weight, soluble polyorganosiloxane. The polyorganosiloxane is subsequently admixed with a reactive dopant source to form a soluble metallosiloxane polymer. The metallosiloxane polymer is coated onto a semiconductor wafer substrate material to produce a metallosiloxane-wafer composite article. The composite article is heated to produce an impurity doped semiconductor wafer suitable for electronic applications. U.S. Pat. No. 4,168,330 to Kaganowicz discloses the use of some siloxanes in the deposition of silicon oxides by glow discharge at low temperatures. Insofar as is known, however, siloxanes have not been thermally decomposed at elevated temperatures to form $SiO_2$ coatings or layers in the manufacture of semiconductors.

SUMMARY OF THE INVENTION

It has now been discovered that siloxanes of the formula $$(H_nR_{2-n}SiO)_m$$

wherein $n=0-2$, and m is 3 or greater, R being lower 1–8 carbon alkyl, aryl, or aralkyl, can be decomposed by oxidation at from about 400° C. and generally from about 500° C. to about 750° C. in a reduced pressure reactor to form a high integrity, conformal $SiO_2$ film or coating or, by adding dopants, to form a highly satisfactory doped $SiO_2$ film in the manufacture of semiconductor devices.

While the principles involved herein are widely applicable to siloxanes in general, cyclic and linear, the greatest advantage is accomplished using cyclic siloxanes, one example of which, 2,4,6,8 tetramethylcyclotetrasiloxane (TMCTS), is commercially available and seems, presently, to provide an approximately optimum set of economic and technical advantages. Tetraethylcyclotetrasiloxane and octamethyltetracyclosiloxane (OCMET) are also advantageously used, and other siloxanes may be considered as potentially equivalents.

DESCRIPTION OF THE PREFERRED EMBODIMENT

Figure 1:
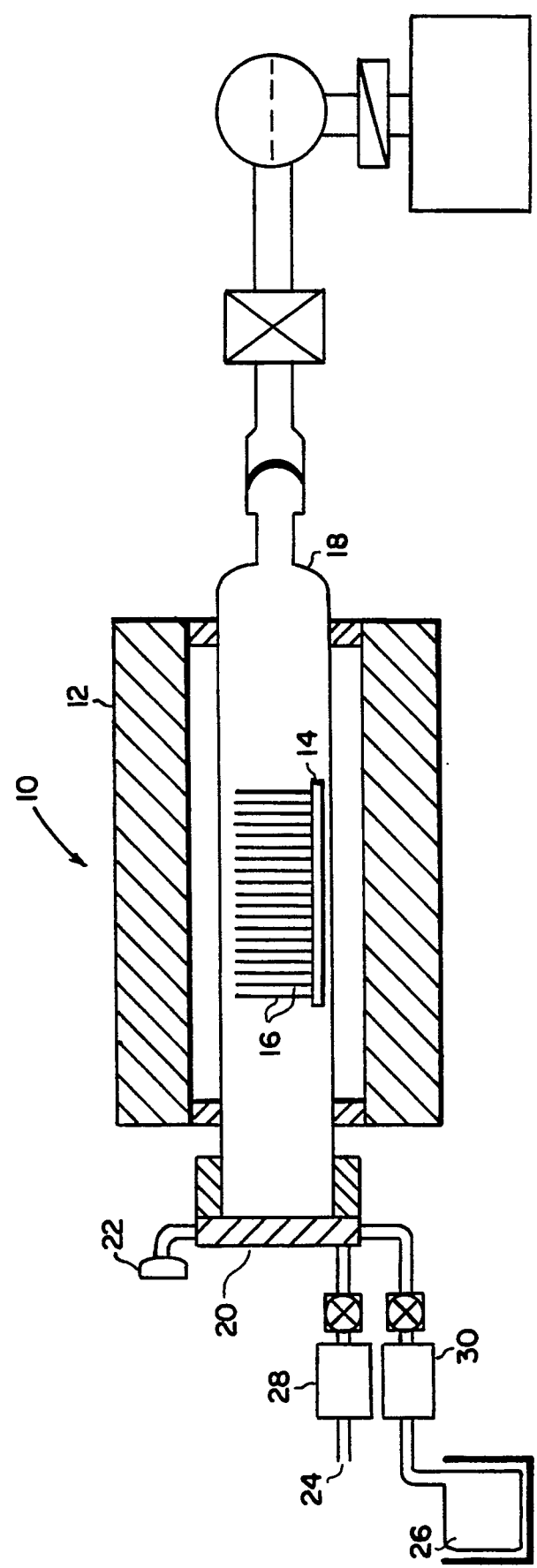
FIG. 1 is a schematic diagram of a simplified low pressure chemical vapor deposition (LPCVD) system.

In recent years, advances in i-line lithography and highly anisotropic plasma etching have made these front-end technologies suitable for submicron device manufacturing. Unfortunately, deposition technology has remained the weakest link in the device fabrication chain. It has failed to keep up with the demands for high conformality and step coverage, lower process temperatures and safer source materials.

For glass deposition, silane with oxygen has long been used to deposit $SiO_2$ from 350° C. to 450° C. in both atmospheric and subatmospheric reactors. These oxides have poorer step coverage than those made from TEOS and silane is a very hazardous material. Other disadvantages of silane processes are gas phase reactions which generate particulates and loosely adhering deposits on reactor walls that act as particle sources. The as-deposited films contain hydrogen as silanol, hydride and water and must be densified by higher temperature anneals to improve their electrical characteristics. With the drive towards submicron feature sizes and high aspect ratio geometries, the use of liquid organosilicon sources like tetraethylorthosilicate (TEOS) has increased dramatically in the past few years. The superior step coverage and higher purity of this material relative to silane has become critical to the fabrication of VLSI devices. TEOS also has significant safety advantages over silane, a pyrophoric toxic gas.

In spite of these TEOS advantages, silane continues to dominate in semiconductor processing because of its broad applicability (oxide, nitride, oxynitride, polysilicon, epitaxial silicon) and lower processing temperature. In accord with the present invention new organosilicon sources have been developed, and processes characterized as alternatives to silane in LPCVD $SiO_2$ deposition. They are generally oligomeric siloxane sources illustrated by 2,4,6,8 tetramethylcyclotetrasiloxane (TMCTS). In general the likely decomposition reaction of these compounds be according to the following generalized formula

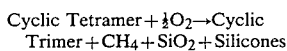

TEOS deposits $SiO_2$ from 650° C. to 750° C. by pyrolytic decomposition. Oxygen is not required although it is often added to control process deposition and film stress. Because of its process temperature, it is a high temperature oxide source material suitable for use as a first level interlayer dielectric over polysilicon, or as a trench liner/filler where process temperature is not a concern.

In recent years, TEOS has received a great deal of attention because of the superior conformality and step coverage of the film made from the organosilane, when compared with the silane film both for doped and undoped glass. Although combustible, it is nonpyrophoric and noncorrosive. TEOS is also much less toxic than silane with a TLV=100 ppm versus silane at TLV=0.5 ppm. Additionally, TEOS can be obtained hermetically sealed in quartz vessels, with the level of metals contamination at 1-2 ppb for each trace element.

Unfortunately, TEOS has several disadvantages relative to silane that limit its use in LPCVD. The process temperature is too high for deposition over metal. A TEOS film is also difficult to dope with phosphorus, and attempts at a production worthy, all liquid Boro Phosphosilicate Glass (BPSG) process have met with limited success. Finally, the low vapor pressure of TEOS makes controlled source delivery difficult. Only recently have mass flow controllers (MFCs) and integrated delivery systems been developed that permit properly controlled delivery of this material.

Table 1 shows properties for as-deposited $SiO_2$ films from TEOS and TMCTS.

TABLE 1

| | TEOS* | TMCTS** | THERMAL |
| --- | --- | --- | --- |
| Process temperature: range (°C.) | 650–750 | 525–650 | N/A |
| Vapor pressure (Torr at 20° C.) | 1.5 | 6 | N/A |
| Conformality (S/T) | 70%–95% | 80%–98% | N/A |
| 1% HF wet etch rate (Å/sec at 21° C.) | 2.5 | 3.0 | ~1 |
| Refractive index (±0.002 @ 632.8 nm) | 1.444 @ 700° C. dep | 1.455 @ 590° C. dep | 1.462 |
| Dielectric breakdown (MV/cm) | 3–8 | 4–7 | 8–10 |
| Film stress a 28° C. ($10^9$ dynes/cm$^2$) | 0.5 T (no oxygen) | 0.2 C to <0.5 T | 3.1 C |
| Applications | Interlayer over poly | Interlayer over refractory metals and silicides | Field oxide |
| Applications | Trench fill where high temperature is not of concern | Trench fill | Gate oxide |
| Applications | BPSG | BPSG | Isolation |
| Applications | Thick oxides | Single water, | |

TABLE 1-continued

| | TEOS* | TMCTS** | THERMAL |
|---|---|---|---|
| | | PECVD, or where high dep rate needed | |
| Applications | | Thick oxide | |
| Applications | | Any TEOS application | |

*Tetraethylorthosilicate
**2,4,6,8 Tetramethylcylotetrasiloxane

The TMCTS source material is a cyclic organosiloxane that is suitable for deposition of $SiO_2$ between 500° C. and 600° C. In distinction to TEOS, TMCTS is stoichiometrically deficient in oxygen and cannot form $SiO_2$ without the addition of oxygen. It is a medium temperature oxide for use as an interlayer dielectric over polysilicon and tungsten, or as a trench liner/filler.

TMCTS is a nonpyrophoric, noncorrosive flammable liquid. It has advantages over TEOS including lower deposition temperature with better conformality and step coverage. While heavily doped TEOS films can be deposited below 600° C., it is not possible to deposit an undoped barrier layer at that temperature, as one can do with TMCTS. As deposited films made with TMCTS have improved density as well as low internal stress. Controlled doping of the TMCTS source is easy with trimethylborate (TMB) and, particularly, trimethylphosphite (TMPI). This is significant, as TMPI is too reactive at TEOS deposition temperatures. Moreover, TMCTS has a much higher vapor pressure than TEOS, making controlled source delivery easier.

TMCTS processes are affected by the variables of temperature, pressure, wafer spacing, etc., in a manner similar to TEOS. But unlike TEOS, TMCTS source depositions are strongly influenced by oxygen. With excess oxygen ($O_2$/TMCTS > 10) an increase in deposition rate and film density is observed, with a concurrent reduction in film stress.

TMCTS films are highly conformal—superior to even TEOS—this despite much lower deposition temperatures. Both LPCVD and remote PECVD carbon-free films have been deposited. Depending on the amount of oxygen used during deposition, film stress can vary between low compressive and low tensile. While internal stress is low, thick coatings (>1.2 μm) are susceptible to cracking due to thermal shock, requiring a slow pull. This thermal stress cracking does not occur on subsequent post-deposition annealing steps The process of this invention is carried out by heating the semiconductor device to which the $SiO_2$ or doped $SiO_2$ coating or layer is to be added to a suitable temperature between about 400° C. and about 650° C., generally in the range of 550°-650° C., sufficient to decompose a mixture of the siloxane and oxygen. The heating is carried out in vacuo or at a reduced pressure, i.e. partial vacuum, generally in the pressure range of 100-500 milliTorr (mTorr) for a period sufficient to form the desired thickness of film, which time is readily calculated from the rate of deposition, which is empirically determined for each siloxane and is a function of temperature. The rate parameters are easily ascertained for a given system and are somewhat a function of the system, thus no one set of rate data is significant, and certainly not critical to the invention.

FIG. 1 is a schematic diagram of a simplified LPCVD system 10 having a furnace 12 adapted to position a wafer boat 14 holding a plurality of wafers 16 to be coated. The wafer boat 14 is held in a vacuum tight furnace tube 18 placed inside furnace 12. Furnace tube 18 is fitted with a vacuum tight door 20 so the wafer boat 14 can be charged to and discharged from the tube 18. Reaction tube 18 and door 20 are so constructed to permit monitoring of the vacuum as by gauge 22 and to permit oxygen 24 and source material 26 to be admitted to tube 18 through flow controllers 28, 30 respectively. The supply of gases and some material to the reactor tube/furnace can be accomplished by well known techniques. Furnace tube 18 is connected through suitable conduits 32, valves 34, traps 36 and the like to a vacuum pump 38 as is well known in the art.

The following examples illustrate, but do not limit, the invention.

EXAMPLE 1

Commercially available tetramethylcyclotetrasiloxane (TMCTS) was purified and vacuum packaged in a quartz container. The container was incorporated in a standard low pressure chemical vapor deposition system capable of handling 4" diameter silicon wafers. TCMTS vapors were drawn from the quartz container, held at a constant temperature of about 16° C. The TMCTS vapors were mixed with oxygen prior to entry into the furnace containing the silicon wafers. Deposition runs were made according to established prior art procedures with certain variables controlled to determine whether suitable $SiO_2$ films could be deposited and, thereafter, to determine the effect of various process parameters on the deposition of $SiO_2$ films on the silicon wafers. The most significant process variables identified were $O_2$:TMCTS ratio and the deposition temperature. $SiO_2$ deposition rates were measured by standard film thickness measurements, using optical reflectance and ellipsometry. Maximum deposition rates were found to be at an $O_2$:TMCTS molar ratio of about 2:1. The deposition rates at this ratio as a function of temperature are shown in Table II.

TABLE II

| $SiO_2$ Deposition at $O_2$:TMCTS Molar Ratio of 2:1 | |
|---|---|
| Temperature | Deposition Rate |
| 550° C. | 25 Angstroms/Min |
| 600° C. | 55 Angstroms/Min |
| 700° C. | 355 Angstroms/Min |

The activation energy for deposition appears to be 29 kcal/mol. However, depletion at 700° C. was apparent.

EXAMPLE 2

TMCTS prepared as in Example 1 was used to deposit a film on 100 mm diameter wafers spaced 9.5 mm apart in a 150 mm inside diameter quartz tube heated to 600° C. under a reactor pressure of 350 mTorr. The ratio of TMCTS to oxygen introduced to the reaction was 15 to 1 resulting in a deposition rate of 85 Å/min.

Set out in Table 3 are the properties of the film produced by the process.

TABLE 3

| Film Properties | |
| --- | --- |
| Refractive Index (632.8 nm) | 1.455 ± .005 |
| P-etch Rate @ 25° C. | 10 Å/sec |
| Breakdown Voltage | 4–6 × $10^6$ Volts/cm |
| Film Stress <3000Å | <1 × $10^9$ dynes/cm$^2$ C |
| 5000–15000Å | <2 × $10^9$ dynes/cm$^2$ T |
| Stoichiometry | 1.0 Si:2.1 Oxygen |
| Uniformity | ±2% |
| Conformality | >90% |

Figure 2:
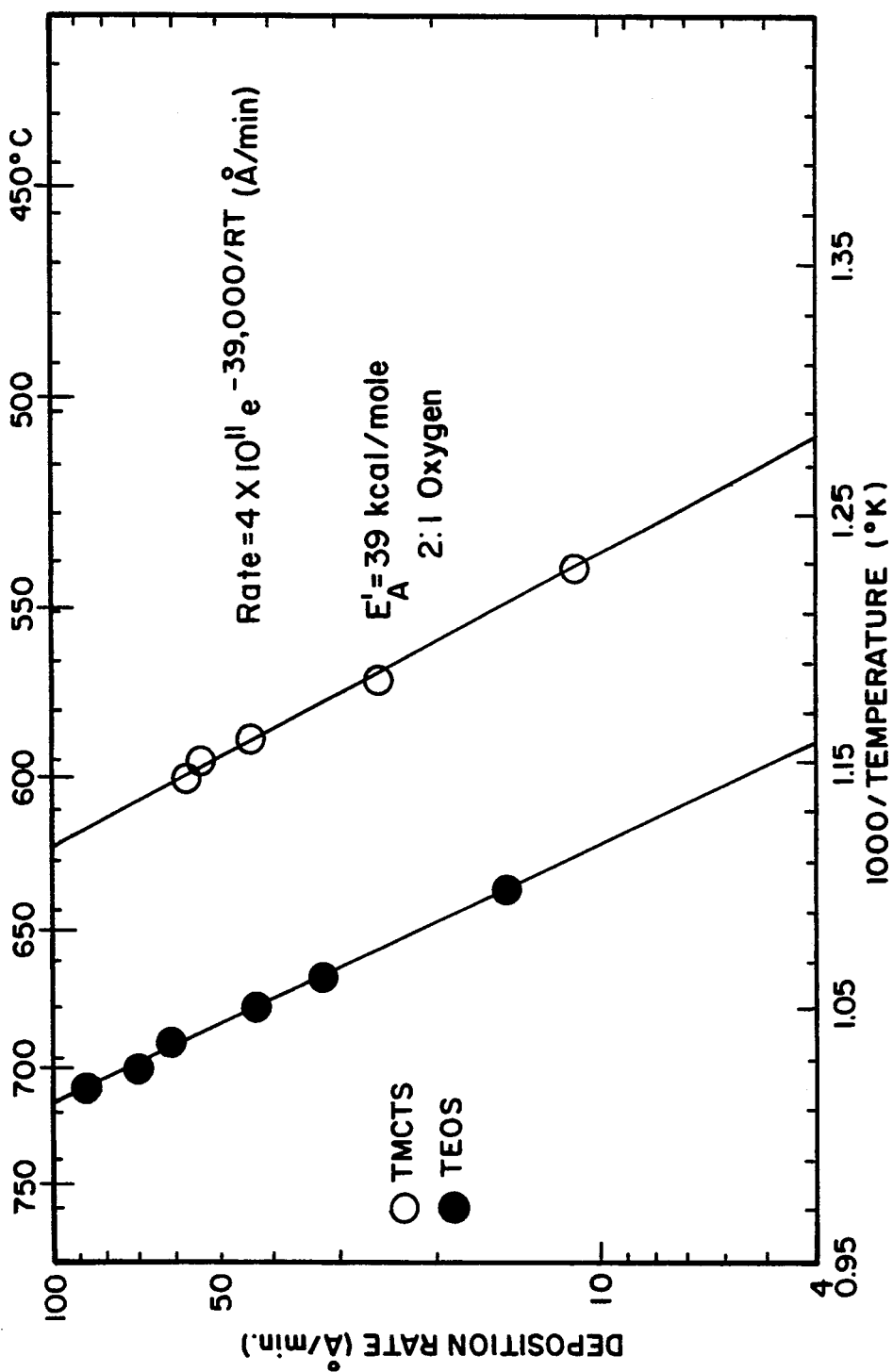
FIG. 2 is a plot of deposition rate against temperature for compositions according to the present invention and those of the prior art.

FIG. 2 is a plot of temperature against deposition rate comparing TMCTS deposited accordingly to the present invention and TEOS. From FIG. 2 it is apparent that TMCTS used as a source at temperatures between 400° C. up to about 650° C. results in deposited films which exhibit excellent step coverage and conformality.

Figure 3:
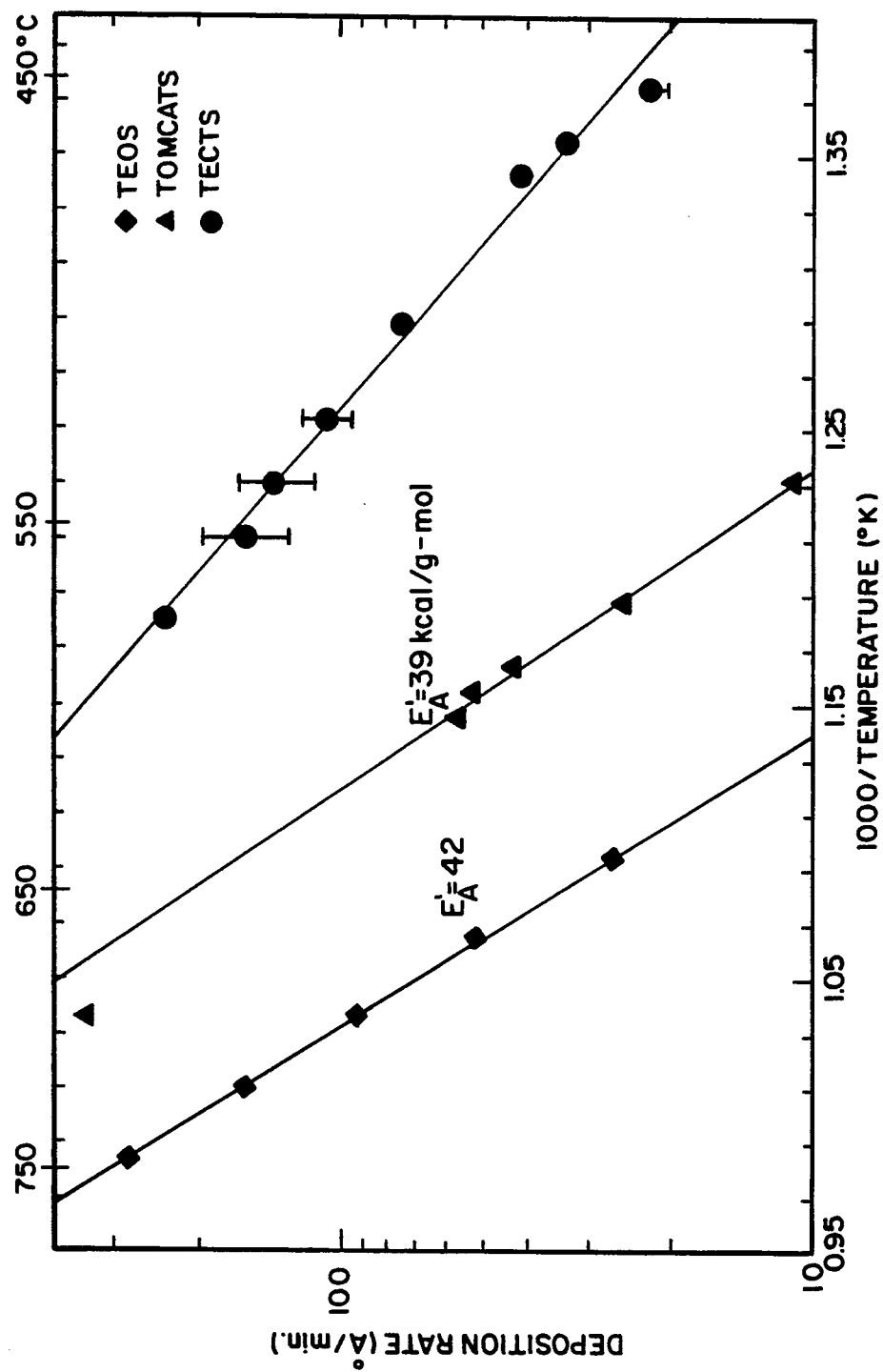
FIG. 3 is a plot of deposition rate against temperature for compositions according to the present invention and those of the prior art.

FIG. 3 is a plot of temperature against deposition rate comparing TEOS, TMCTS and tetraethyl-cylotetrasiloxane (TECTS) showing alternate sources according to the present invention are just as effective.

EXAMPLE 3

Commercially available octamethylcyclotetrasiloxane (OCMET) was run using the protocol of Example 1. The deposition rate was very much lower than that observed with TMCTS, being only 5 Angstroms/minute at 750° C.

As demonstrated, TMCTS may be used as a silicone oxide source in the temperature range of from about 400° C. to above 700° C.

The surprisingly high quality and favorable deposition rates of $SiO_2$ deposition using TMCTS makes it, presently, a greatly preferred siloxane; however, as demonstrated using TECTS, other siloxanes can be considered as potentially equivalent in the sense that deposition of $SiO_2$ can be accomplished. The siloxanes considered suitable for use in the present process are of the general formula

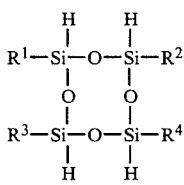

wherein $R^1$, $R^2$, $R^3$ and $R^4$ are hydrogen or lower alkyl, aryl or aralkyl having up to 8 carbons. In the preferred compound, all of $R^1$, $R^2$, $R^3$ and $R^4$ are methyl.

In a more general sense, the preferred class of siloxane compounds have the general formula

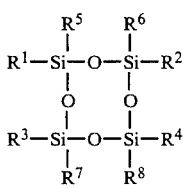

wherein $R^5$, $R^6$, $R^7$ and $R^8$ as well as $R^1$, $R^2$, $R^3$ and $R^4$ are hydrogen or lower alkyl, aryl or aralkyl having up to 8 carbons.

In a still more general sense, analogous trimer, pentamer and hexamer siloxanes and other cyclic siloxanes are considered as suitable equivalents to the preferred compound and class of compounds. Indeed, in a still more general sense, cyclic and acyclic siloxane compounds of the formula $$(-H_nR_{2-n}SiO-)_m$$

wherein n=0–2, and m is 2 or greater and R is lower 1-8 carbon alkyl, aryl, or aralkyl are considered to be generally equivalent to the preferred compounds. Exemplary of such compounds are, of course, 1,3,5,7 tetramethylcyclotetrasiloxane and octamethyltetracyclosiloxane, decamethyltetrasiloxane, octaphenylcyclotetrasiloxane, 1,3,5,7-tetramethyl-1,3,5,7-tetraphenylcyclotetrasiloxane, 1,1,1,3,5,5,5-heptamethyl-3-t-butylsiloxytrisiloxane, 1,1,1,3,5,5,5-heptamethyltrisiloxane and 1,1,3,5,5-pehtamethyl-1,3,5-triphenyltrisiloxane.

Dopants may optionally be included in the mixture of oxygen, either pure or as air, to provide a suitably doped $SiO_2$ layer. For example, such dopants as phosphorus oxychloride, trimethyl phosphite, trimethyl phosphate, boron tribromide, trimethyl borate, triethyl borate, phosphorous tribromide, antimony trioxide, phosphorus trichloride, and, in general, compounds of boron, phosphorus, arsenic, chromium, antimony and other dopant elements which are capable of being volatilized may be used.

EXAMPLE 4

A phosphorus doped film was deposited according to the present invention by utilizing the following process parameters:

| | |
| --- | --- |
| 100 mm wafers, 9.5 mm apart | |
| Deposition temperature | 560° C. |
| Reactor pressure | 850 mTorr |
| Oxygen:TMCTS Ratio | 15:1 |
| Trimethylphosphite*/TMCTS Ratio | 0.20 |
| TMCTS delivery rate | 0.4 g/min |
| Deposition rate 4% PSG | 100Å/min |

*Trimethylphosphite is added through a standard injector

EXAMPLE 5

Figure 4:
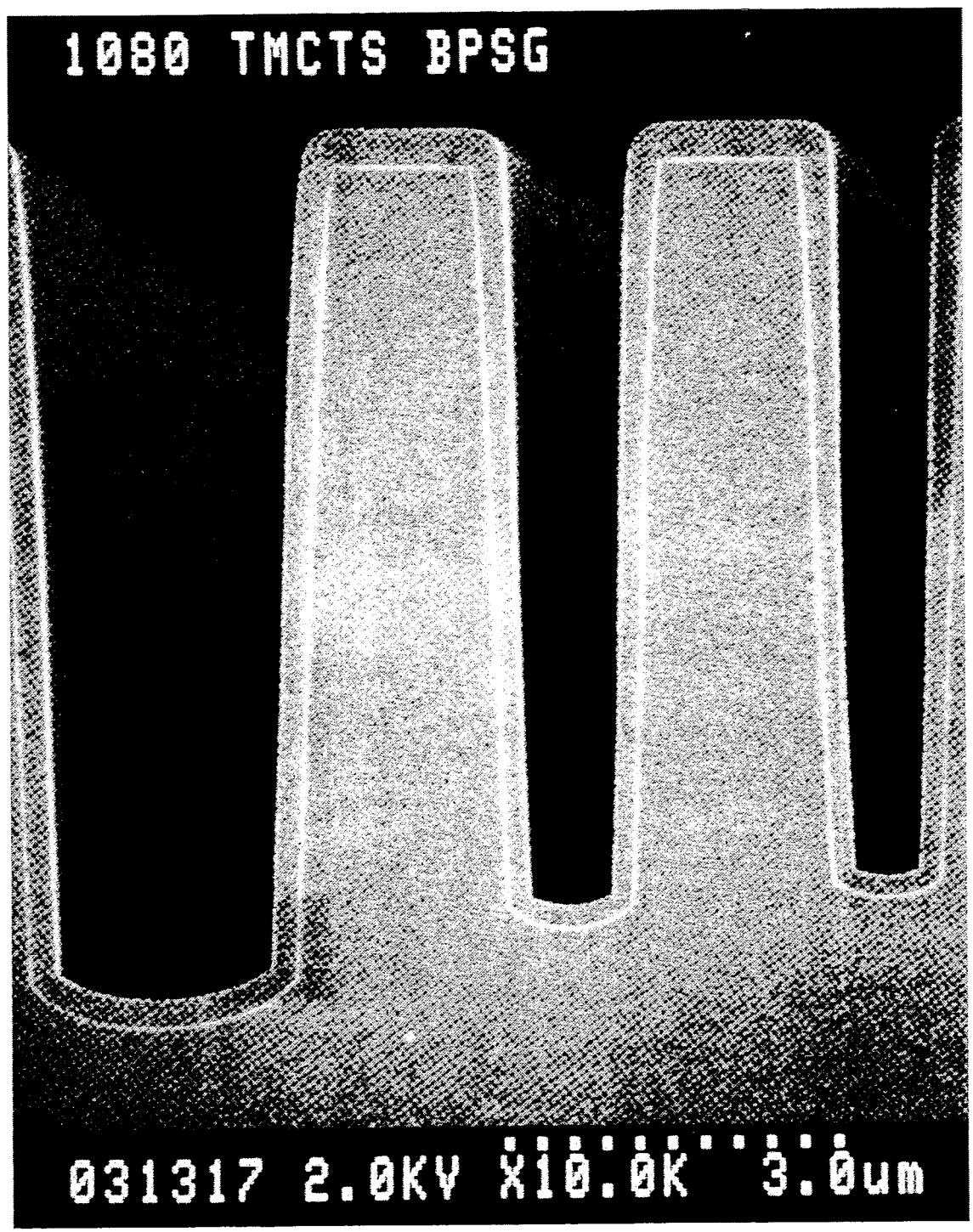
FIG. 4 is a photograph of a scanning electron microscope of a borophosphosilicate glass coating deposited using the process of the present invention.

A 3% Boron, 4% Phosphorus Boro Phospho Silicate glass layer was deposited according to present invention by utilizing the following process parameters:
Wafer Size: 100 mm
Wafer Spacing: 9.5 mm
Quartz Tube ID: 150 mm
Deposition Temperature: 560° C.
Furnace Pressure: 850 m Torr
TMCTS Flow: 37 sccm
TMP Flow: 15 scm
TMB Flow: 30 scm
Oxygen Flow: 1025 sccm FIG. 4 is a scanning electron microscope photograph of a borophosphosilicate glass film deposited according to the present invention.

From the foregoing deposition and example the Advantages of Oligomeric Siloxanes as Sources for a Silicon Oxide Deposition are:
1. TMCTS films are deposited at lower temperature than TEOS films.
2. Films made from TMCTS are high quality and conformal.

3. TMCTS is easy to deliver.
4. TMCTS is not hazardous.
5. TMCTS can be used with liquid phosphorus sources.

STATEMENT OF INDUSTRIAL APPLICATION

This invention finds application in the manufacture of semiconductor devices.

Oligomeric siloxane are also good sources for dopant glass deposition from an all liquid source system non-hydride therefore non-hazardous as illustrated by the following example.

I claim:

1. The method of manufacturing a semiconductor device comprising depositing in a low pressure chemical vapor deposition system a layer of SiO₂ or doped SiO₂ by the oxidation of a siloxane selected from the group consisting of 2,4,6,8 tetramethylcyclotetrasiloxane, 2,4,6,8 tetraethylcyclotetrasiloxane and octamethyltetracyclosiloxane, decamethyltetrasiloxane, octaphenylcyclotetrasiloxane, 1,3,5,7-tetramethyl-1,3,5,7-tetraphenylcyclotetrasiloxane, 1,1,1,3,5,5,5-heptamethyl-3-tri-(butyl)siloxytrisiloxane, 1,1,1,3,5,5,5-heptamethyltrisiloxane and 1,1,3,5,5-pentamethyl-1,3,5-triphenyltrisiloxane on the hot surface of such semiconductor device at a pressure of less than about 500 mTorr and at a temperature of at least about 400° C. and up to about 625° C., whereby said deposited layer of SiO₂ exhibits excellent step coverage and conformality.

2. In the manufacture of semiconductor devices, the steps of forming a layer of silicon dioxide or doped silicon dioxide comprising heating the device upon which the silicon dioxide layer is to be formed to a temperature of from about 400° C. to about 625° C. in a partial vacuum of about 500 mTorr or less and flowing a mixture of a siloxane and an oxidant over the heated device to cause the siloxane to oxidize on the surface of the device forming a layer of silicon dioxide, whereby said deposited layer of SiO₂ exhibits excellent step coverage and conformality.

3. The manufacture of semiconductor devices of claim 2 wherein the siloxane is a cyclic siloxane.

4. The manufacture of semiconductor devices of claim 3 wherein the siloxane is 2,4,6,8 tetramethylcyclotetrasiloxane.

5. The manufacture of semiconductor devices of claim 4 wherein the silicon dioxide layer is doped and wherein the dopant is selected from compounds of boron, phosphorus, arsenic, chromium or antimony.

6. In the manufacture of semiconductor devices, the steps of forming a layer of silicon dioxide or doped silicon dioxide comprising heating the device upon which the silicon dioxide layer is to be formed to a temperature of from about 400° C. to about 625° C. in a partial vacuum of about 500 mTorr or less and flowing a mixture of a siloxane having the general formula

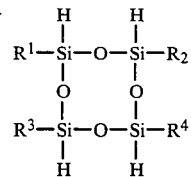

wherein $R^1$, $R^2$, $R^3$ and $R^4$ are hydrogen or lower alkyl, aryl, or aralkyl having up to 8 carbons, and oxygen over the heated device to cause the siloxane to decompose on the surface of the device forming said layer of silicon dioxide, whereby said deposited layer of SiO₂ exhibits excellent step coverage and conformality.

7. The process of claim 6 wherein all of $R^1$, $R^2$, $R^3$ and $R^4$ are methyl.

8. In the manufacture of semiconductor devices, the steps of forming a layer of silicon dioxide or doped silicon dioxide comprising heating the device upon which the silicon dioxide layer is to be formed to a temperature of from about 400° C. to about 625° C. in a partial vacuum of about 500 mTorr or less and flowing a mixture of a siloxane having the general formula

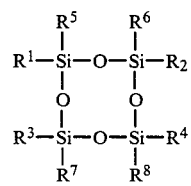

wherein $R^1$, $R^2$, $R^3$, $R^4$, $R^5$, $R^6$, $R^7$, and $R^8$ are hydrogen or lower alkyl, aryl or aralkyl having up to 8 carbons and oxygen over the heated device to cause the siloxane to oxidize on the surface of the device forming said layer of silicon dioxide, whereby said deposited layer of SiO₂ exhibits excellent step coverage and conformality.

9. In the manufacture of semiconductor devices, the steps of forming a layer of silicon dioxide or doped silicon dioxide comprising heating the device upon which the silicon dioxide layer is to be formed to a temperature of from about 400° C. to about 625° C. in a partial vacuum of about 500 m/Torr or less and flowing a mixture of a cyclic or acyclic siloxane compound having the formula

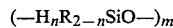

wherein n=0-2, and m is 2 or greater and R is lower 1-8 carbon alkyl, aryl, or aralkyl and oxygen over the heated device to cause the siloxane to oxidize on the surface of the device forming said layer of silicon dioxide, whereby said deposited layer of SiO₂ exhibits excellent step coverage and conformality.

10. In the manufacture of semiconductor devices, the steps of forming a layer of silicon dioxide or doped silicon dioxide comprising heating the device upon which the silicon dioxide layer is to be formed to a temperature of from about 500° C. to about 625° C. in a partial vacuum of about 500 mTorr or less and flowing a mixture of tetramethylcyclotetrasiloxane and oxygen over the heated device to cause said siloxane to oxidize on the surface of the device forming said layer of silicon dioxide, whereby said deposited layer of SiO₂ exhibits excellent step coverage and conformality.

* * * * *